United States Patent
Goodman et al.

[11] Patent Number: 5,910,644
[45] Date of Patent: *Jun. 8, 1999

[54] UNIVERSAL SURFACE FINISH FOR DCA, SMT AND PAD ON PAD INTERCONNECTIONS

[75] Inventors: Dale E. Goodman, Oronoco; Mark K. Hoffmeyer, Rochester; Roger S. Krabbenhoft, Elgin, all of Minn.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/873,060

[22] Filed: Jun. 11, 1997

[51] Int. Cl.⁶ .................................................. H05K 1/16
[52] U.S. Cl. ............................................ 174/260; 438/614
[58] Field of Search ............................ 427/125, 96, 61, 427/531; 361/760, 767, 768, 771; 174/250, 260, 268; 438/614

[56] References Cited

U.S. PATENT DOCUMENTS

| | | | |
|---|---|---|---|
| 4,068,022 | 1/1978 | Glick | 427/125 |
| 4,109,297 | 8/1978 | Lesh et al. | 361/272 |
| 5,169,680 | 12/1992 | Ting et al. | 427/96 |
| 5,235,139 | 8/1993 | Bengston et al. | 174/257 |
| 5,249,728 | 10/1993 | Lam | 228/111 |
| 5,272,596 | 12/1993 | Honore et al. | 361/633 |
| 5,400,221 | 3/1995 | Kawaguchi | 361/771 |
| 5,420,073 | 5/1995 | DiGiacomo et al. | 427/96 |
| 5,485,352 | 1/1996 | Shibuya et al. | 361/771 |
| 5,587,336 | 12/1996 | Wang et al. | 437/183 |

*Primary Examiner*—Kristine Kincaid
*Assistant Examiner*—William Silverio
*Attorney, Agent, or Firm*—Robert W. Lahtinen; Matthew J. Bussan

[57] ABSTRACT

A printed circuit connector terminal pad coating technique is disclosed which functions as a single universal pad surface which supports multiple electrical connection practices including wirebonding, soldering, and wear resistant, pad on pad mechanical connection. The tri-plate surface treatment includes an initial diffusion resistant coating of nickel; an intermediate layer of hard, wear resistant noble or semi-noble metal that provides pad on pad connector reliability and affords a metallurgically stable solder joints and wirebond interfaces; and a final coating of soft gold. The intermediate layer may be pure palladium having a nominal thickness of 35 microinches or a layer of gold, hardened by cobalt, nickel, iron or a combination of these dopants to effect a hardness of 200 to 250 (Knoop scale). The use of a common surface treatment for the multiple attachment processes is implemented with a single masking step, rather than a sequence of selective masking, plating and stripping operations. In the printed circuit environment, the masking is provided by the final covering that encloses, seals, and electrically insulates the conductors in a circuit board application or in the instance of a flexcable, the adhesive coated flexible coverlay the covers and seals the copper conductor elements while exposing the conductor terminal pads.

14 Claims, 5 Drawing Sheets

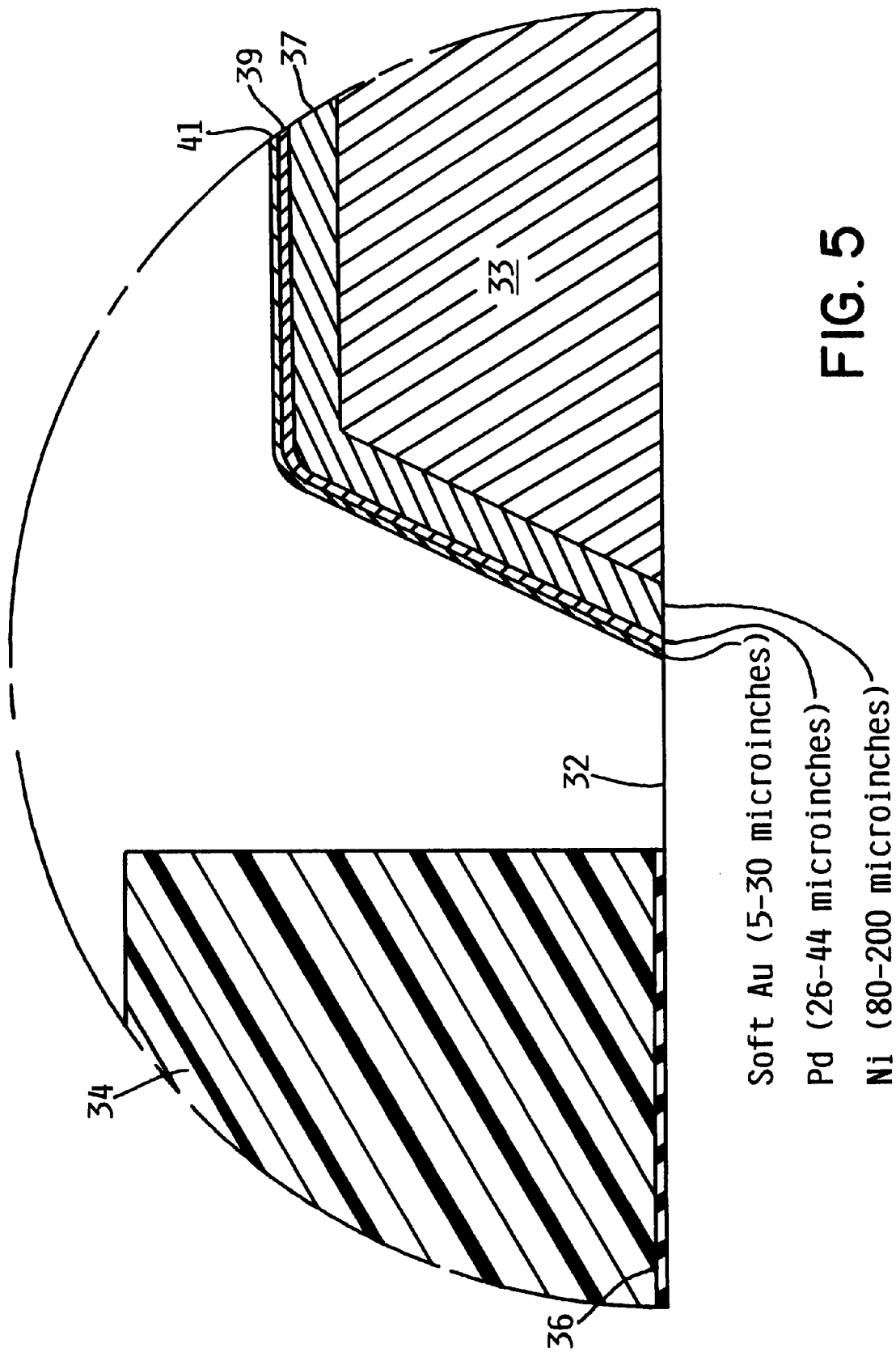

UNIVERSAL SURFACE FINISH FOR DCA, SMT AND PAD ON PAD INTERCONNECTIONS

FIELD OF THE INVENTION

The present invention pertains to electrical connection techniques and structures and more particularly to a layered surface treatment to commonly support multiple electrical connection techniques including wirebonding, soldering and wear resistant mechanical connection.

BACKGROUND OF THE INVENTION

A conventional printed circuit device, such as a flexcable package or printed circuit board, has pads for attachment of surface mounted devices and connection to other circuit elements. The surfaces are masked and the exposed pads prepared with appropriate coatings for the attachment process. Where multiple attachment techniques are used, the preparatory coatings of the pads must be adapted to the particular connective process employed.

Several types of attachment require pad coatings with differing physical characteristics. The application described in this document, as an example of a device employing multiple attachment techniques, is a flexcable that carries wirebond chips and discrete components in addition to interconnecting with the balance of the host device. The flexcable illustrated and described is a typical flexcable which is supported by a disk drive actuator rotor, connects to the transducer head lead wires and the host device electronics and supports an arm electronics (AE) module and discrete components. This type flexcable package possesses mounting and attach pads that support four distinct types of interconnection requirements:

1. Chip on flex (COF) attach pads for direct chip attach (DCA) aluminum wire wedge bonding of the AE chip.

2. Pads for solder attachment of passive discrete surface mount technology (SMT) components.

3. Pad surfaces for connector contacts of an SMT pad on pad connector required for card electronics to flexcable interconnection.

4. Head lead pads for wirebond attachment of gold plated copper wire used for magneto resistive (MR) transducer head to flexcable interconnections.

In this example of flexcable structure, reliable wirebonding of the AE module chip-to-flex and head lead to flex requires the use of soft, ultra high purity noble or semi-noble plated surface finishes such as gold, silver, or palladium over nickel based undercoatings. Pad on pad contact areas require hard, wear resistant surfaces usually provided through plating of finishes such as gold flashed nickel-palladium or cobalt/nickel hardened gold over nickel based underplatings. Further, any and all surface finishes must also be SMT compatible and provide both adequate solderability and favorable metallurgical interface reactions to ensure formation of consistently robust solder joints.

In many devices that have diverse interconnection types, surface finish materials selection problems can be circumvented by selectively plating given carrier regions with different metallurgies that support specific interconnect functions. Unfortunately, selective plating applications require circuit masking and associated mask application, stripping and cleaning processes. Therefore, when multiple regions of different platings are needed to support several interconnection functions, use of selective area plating can drive exceedingly complex, time consuming, and expensive circuit manufacture. As electronic devices become price sensitive commodity products, designs must have inherent low cost of manufacture to help enable competitive pricing. Further, the use of successive masking, plating and stripping sequences can result in the presence of masking residues which can complicate or compromise the connections that are implemented after the initial masking and plating sequence. Clearly, a cost effective universal interconnect finish has both strategic and economic value.

Numerous material sets have been proposed and used for terminal pad surface preparation, but these have been directed either to solder and wirebond applications or to connector applications, not both. In practice, it has been a requirement that a thin intermediate layer of harder material must be used in the soldering and wirebonding environment, while a thick intermediate layer must be present for mechanical connector applications.

SUMMARY

The structure and technique of the present invention provides a common, universal surface finish for printed circuit electrical conductor termination pads that supports wirebonding, SMT and pin in hole (PIH) soldering techniques, and wear resistant mechanical connections. This is accomplished by plating the copper pads first with a nickel coating to preclude diffusion of copper to the attachment surface; then an intermediate hard, wear resistant coating of pure noble or semi-noble metal, such as palladium and finally an upper layer of soft gold. In many combined wirebonding, soldering and wear resistant connection environments, the common surface treatment can be achieved using a hard gold layer, formed by doping gold with cobalt, nickel, iron or some combination of any or all of the three metal dopants rather than a layer of pure, hard noble metal like palladium. The limitation of this alternative structure is that where wirebonding with aluminum leads is required, gold-aluminum intermetallic compounds will grow at the attachment interfaces and can compromise the integrity of the connections.

Using the universal tri-layer surface treatment, the use of sequential masking, plating and stripping procedures is eliminated. Only one masking of the terminal pads is necessary and this is provided by the coating of insulation over the printed circuit conductors. On a circuit board, the masking is provided by the insulating coating applied over the copper conductor paths and in a flexcable, as illustrated herein, the masking is provided by the adhesive coated coverlay applied to the flexcable surface to enclose and electrically insulate the conductors while exposing the electrical terminal pads.

Thus the tri-layered surface treatment is cost effective by not only providing a common connector pad surface treatment for all wirebonding, SMT soldering, and wear resistant mechanical connections, but also uses the existing coating which seals, encloses, and electrically insulates the printed circuit conductors to provide the masking function for the single surface preparation plating sequence.

BRIEF DESCRIPTION OF THE DRAWINGS

FIG. 5 an enlarged view of a terminal pad of FIG. 4 illustrating the tri-layer surface treatment of the present invention.

DETAILED DESCRIPTION

Figure 1:
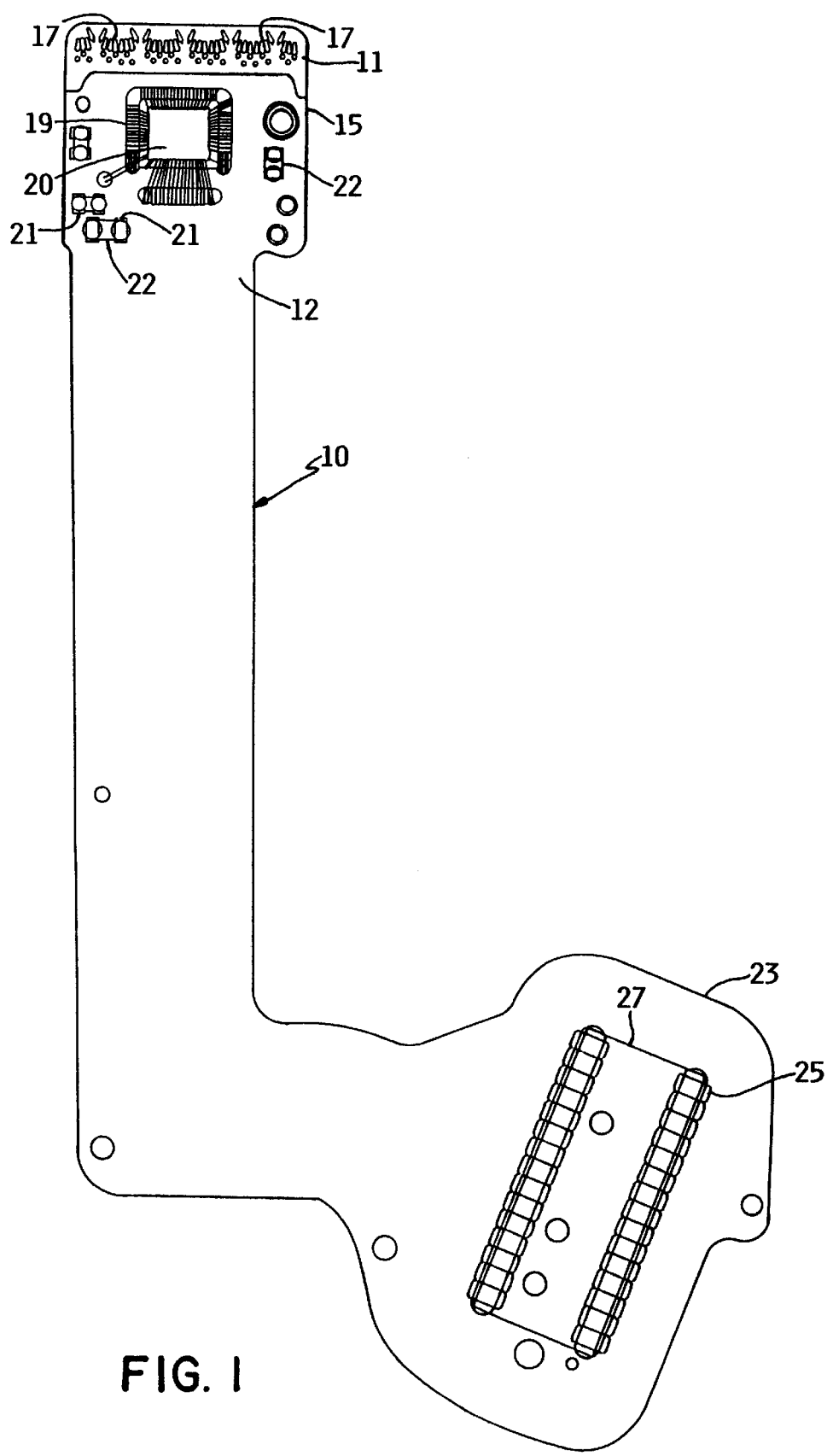
FIG. 1 illustrates a typical flexcable for use with a rigid disk drive actuator which requires the use of wirebonding, soldering, and pad on pad, wear resistant electrical connections.

The varying attachment techniques for making electrical connections to copper circuit terminal pads have differing requirements. The use of a diffusion barrier, typically plated nickel, covered by a thin flash or modest thickness of gold plating are effective for both soldering and wirebonding. The soft gold layer provides a clean surface that is both corrosion resistant and free of contaminant films. These surface attributes ensure consistent and reliable metallurgical bonds in wirebond interconnections, and complete wetting of molten solder to SMT pads for consistent component solder joint formation. Solder joint reliability is also ensured when the gold plating layer is applied sufficiently thin so as to completely dissolve into the bulk of the molten solder during SMT attach sequences. A clean, contaminant film free, corrosion resistant surface layer such as gold is also necessary to ensure electrical reliability of mechanical contacts such as pad on pad or pin in socket interconnections. However, the diffusion layer and soft gold layer surface treatment is not adequate for mechanical contact interconnections as wear resistance of the plating is also required. Reliability problems with mechanical contacts are circumvented by applying an intermediate plating layer that has sufficient wear resistance and chemical nobility to support reliable formation of mechanically interconnected pad on pad or socketed electrical contacts. By using a wear resistant noble or semi-noble plating material applied intermediate to the barrier plating and final soft surface gold layer, corrosion problems resulting from mechanical contact wear through to the non-noble barrier plating are eliminated. However, use of an intermediate plating layer in the overall plating system must also provide a substructure beneath the soft gold surface layer that still provides for good initial solderability and wirebondability, and also provides for acceptable solder joint and wirebond interconnect reliability performance over time. Specifically, robust and reliable metallurgical interconnects such as wirebond and solder joint interfaces must withstand thermally induced stresses that result from elevated and cyclic temperature exposures caused from typical device operation and power on/off cycling. Of specific concern are internal stresses that can arise within the metallurgically bonded interconnects and their relationship to the plating materials system selected for circuitized pads on the electronic carrier. In general, chemical reactions between metals and alloys comprising the interconnect and circuit pad metallizations will occur with time and exposure to elevated temperature. These chemical reactions occur predominantly at wirebond and solder interconnect interfaces, and usually involve structural, volume, or phase changes resulting from chemical diffusion processes including the nucleation and growth of intermetallic compound phases. If internal stresses resulting from phase changes such as these remain concentrated at the interconnect interfaces, cracking or separation of the metallurgical bonded contacts can result and prompt bond failures. To ensure reliability of wirebond interconnects, the intermediate wear resistant plating layer must allow for stress redistribution away from wirebond interfaces that result from intermetallic compound formation between wirebond metals and surface plating metals. For these conditions, the use of high purity, wear resistant material as the intermediate plating layer assists in reducing stresses at the connective interfaces. For reliable solder joint interfaces, any reaction products which form must also not prompt significant strength degradation of the solder interconnects as well. Therefore, the barrier layer, intermediated layer, and surface layer treatment combination of circuit carrier must possess specific material properties and favorable long term chemical interaction characteristics with respect to the interconnect materials set to ensure high yield initial assembly, robust interconnection formation and long term reliability.

This document includes references to soft gold, hard gold, and palladium. Soft gold is used to indicate gold having the properties of pure gold which is typically defined as being 99.9% pure gold with limitations on the type and quantity of the metallic impurities that are present in the remaining 0.1% of the material. Hard gold typically includes dopant impurities in the form of cobalt and nickel which are introduced and alloyed with the gold, with the impurity content in the range of hundreds of parts per million and probably not exceeding 1000 parts per million. This introduction of dopants will give the alloy a hardness of HK25 130 to 250 (Knoop hardness scale). Though this hard gold is not a hard material when compared to most common metals and alloys, it does represent a substantial increase in hardness, as compared to soft or pure gold, and enables successful pad on pad wear resistant connections. Palladium in the commercially pure state includes minimal impurities and no intentionally added hardening agents, but has the hardness and wear resistance possessed by hard gold as described above. As used to practice the present invention, the palladium is 99.9% pure, fine grained, equiaxed and possesses a hardness of HK25 200–250 (Knoop hardness scale).

Figure 2:
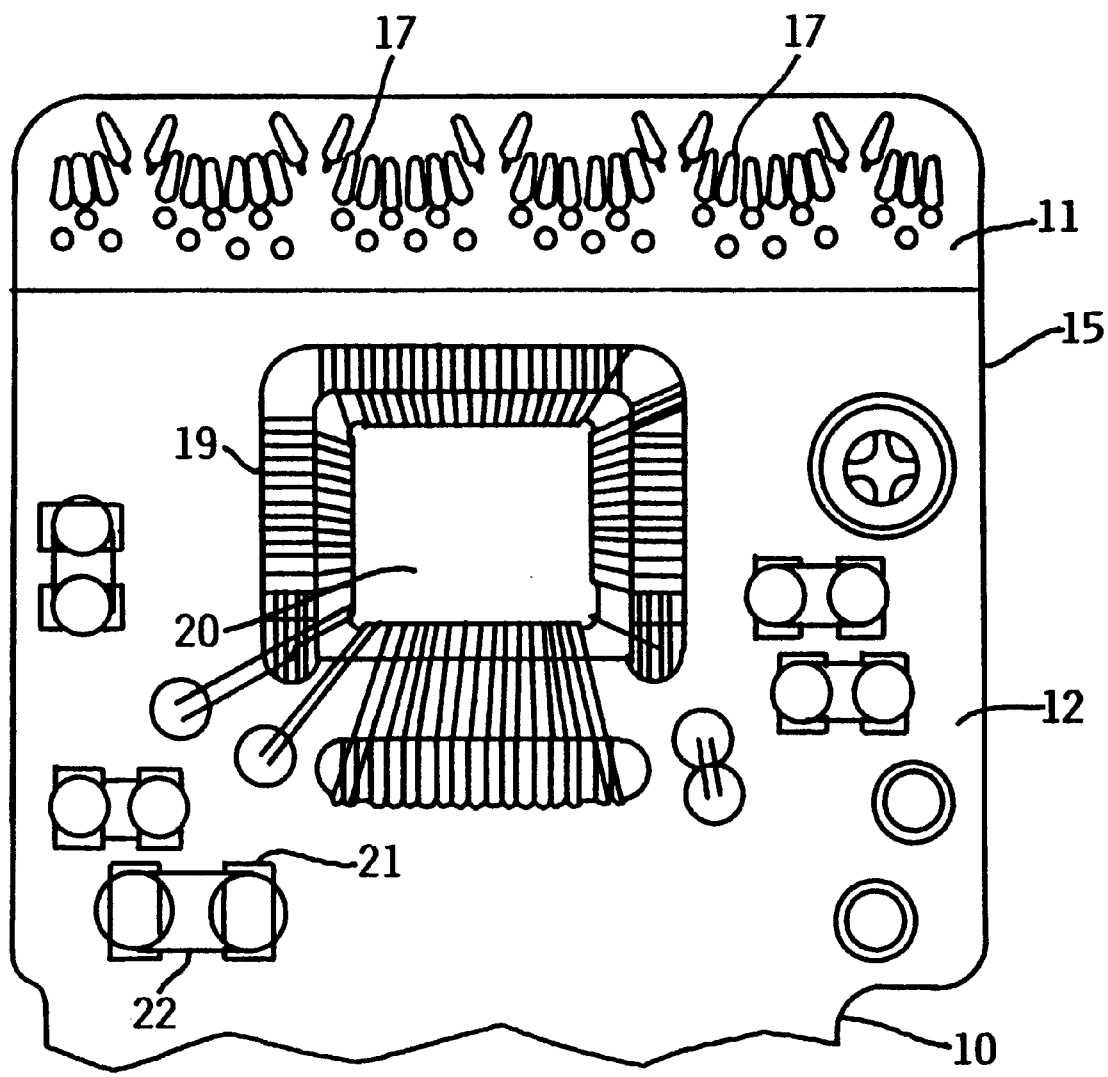
FIG. 2 is an enlarged view of the end portion of the flexcable which is supported on the actuator and includes connection pads for wire leads extending from the transducers.
Figure 3:
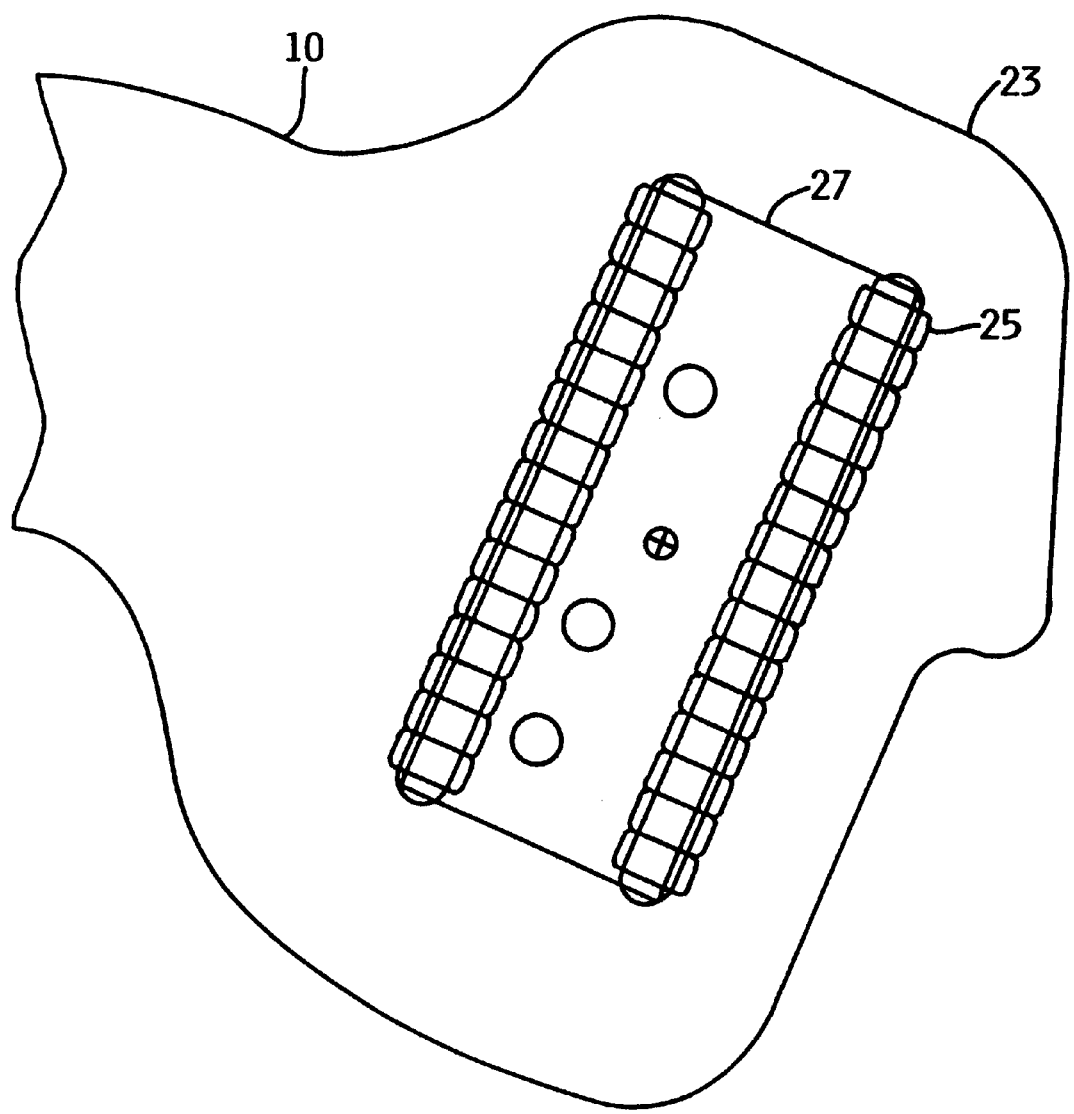
FIG. 3 is an enlarged view of the end portion of the flexcable of FIG. 1 which is attached to the stationary, principal circuitry of the disk drive.

Although the present technique and structure is applicable to any structure to which components and lead wires are connected by surface mounting processes, the following description will show and describe the universal surface finish in the environment of a flexcable. FIG. 1 shows a flexcable 10 of the type commonly used in rigid disk data storage devices to interconnect the magnetic transducer heads and the principal electronic circuitry of the drive. The cable is formed of flexible insulating material 11, such as polyamide, on which conductors are formed either by deposition techniques or by etching away portions of a continuous layer of conductive material. A coverlay 12 of electrically insulating, flexible material serves both to insulate the conductors and mask the terminal pads through which attachment is made to such flexible conductors. An end portion 15 of the flexcable is attached to the movable portion of a disk drive actuator that supports the transducer heads for motion from one track location to another on the surface of the disk. The flexcable end portion presents a series of pads 17 to which the lead wires from the transducer heads are attached; the mounting pads 19 for attachment of an arm electronics module 20; and a series of pads 21 to which are attached discrete components 22. The opposite end portion 23 of flexcable 10 presents masked pads at which a connector 27 mechanically effects pad on pad contact to interconnect the flexcable 10 with the principal circuitry of the disk drive resident on a circuit board outside the sealed enclosure that surrounds the rotating disks and transducing mechanisms. The intermediate length of flexcable 10 includes the conductors extending between the end portion 15, mounted on the movable element of the actuator and the end portion 23 which is secured to a stationary base member and accommodates the relative motion between the secured ends. The details of flexcable end portions 15 and 23 are shown in enlarged form in FIGS. 2 and 3 respectively.

The pads 17 along the flexcable end receive the gold plated copper lead wires from the transducers which are wirebonded thereto using ultrasonic energy. The leads from AE chip 20 are wedgebonded to the flexcable pads 19. Discrete components 22 are soldered to the flexcable pads 21 using SMT. At the opposite end 23 of the flexcable 10, wear resistant pads 25 are required for engagement with the connector 27 that is securely clamped against the pads to assure a positive pad on pad mechanical connection and electrical continuity at each interface. To avoid a sequence of selective masking, plating and stripping operations, a single layered coating of the masked pad surfaces, adequate for all required types of component and lead connection is necessary. The layered surface finish must provide for wirebond, solderable and wear resistant connections.

A solution for development of a cost effective universal surface finish has been developed by applying a specific sequence of electrolytically plated metallurgies to generate a novel, layered tri-plate structure. The layered tri-plate finish provides compatibility for reliable interconnect formation in DCA, SMT and mechanical connector applications. The resultant plating structure is also cost effective to apply, as modifications to the cable design and manufacturing sequence eliminate the need to use separate plating mask process steps or selective plating operations.

Figure 4:
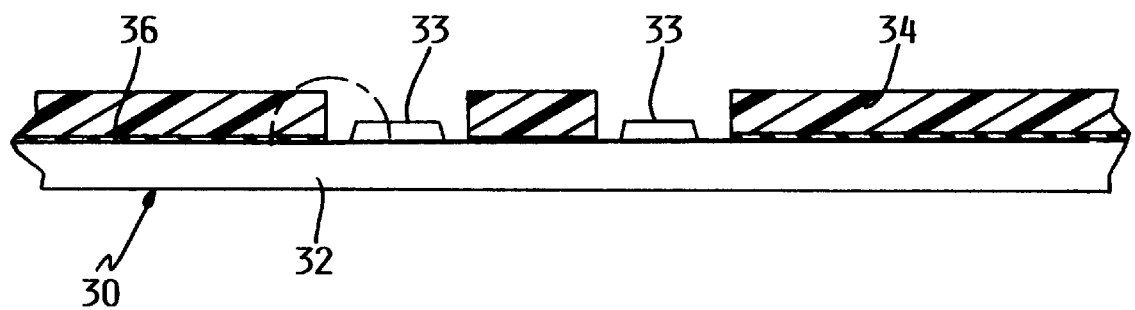
FIG. 4 schematically shows the masking about terminal pads of the flexcable of FIG. 1 effected by the coverlay material.

FIG. 4 schematically illustrates a portion of flexcable 30 wherein a base 32 of flexible, electrically insulating material supports conductors which terminate at pads 33 which are masked by a coverlay 34 of flexible, electrically insulating material similar or identical to that of the base material. The coverlay 34 carries a layer of adhesive 36 which secures the coverlay to the base 32 and conductors supported thereon. The identified detail of FIG. 4, shown enlarged in FIG. 5, reveals the plated layers that have been applied to the copper pad 33 in accordance with present invention. In one form, the universal tri-plate layered finish consists of a nickel underplate layer 37; overplated with an intermediate layer 39 of hard, pure noble metal such as palladium, overplated with a final surface finish treatment as a layer 41 of high purity soft gold. The plated layer 37 of nickel provides a diffusion barrier over the copper pad. The plated palladium layer 39 affords a pure semi-noble metal layer that supports wirebonding and provides a hard, wear resistant, corrosion resistant surface for pad on pad mechanical connections. The thin soft gold layer 41 enhances solderability and seals the otherwise exposed palladium surface to prevent the palladium from attracting hydrocarbons from the surrounding atmosphere that could form as a contaminant film on the surface. Each of the plated layers 37, 39 add 41 are electrolytically or electrolessly plated to form a high quality; dense, low porosity highly adherent film that is uniform and smooth with a substantially uniform grain size. Instead of using expensive multiple selective plating processes, the native flexcable coverlay is used as a plating mask during application of the nickel, hard gold and soft gold platings. By using this process strategy, the flexible coverlay acts as an integral mask for of the layered universal plating finish. The process enhancement provides significant cost reduction since all independent mask application and strip steps required for selective plating processes are eliminated.

By using the flexible coverlay as the sole plating mask, only areas of copper base circuitry exposed through openings in the flex circuit coverlay are plated with nickel during initial electrolytic plating. This nickel underplating is applied in thicknesses ranging from 80 to several hundred microinches as a barrier to prevent diffusion of base copper to the surface of the gold overplate finish. After the nickel is plated, a palladium intermediate layer is applied over the nickel plating, followed by the final electrolytic plating of a high purity soft gold.

The plating sequence, applied plating layer thicknesses, and plating compositions are all critical for high assembly yield and high reliability DCA wirebonding, soldering, and pad on pad mechanical interconnections. A high purity soft gold layer must be applied as the top surface finish layer for high yield wirebonding, while the intermediate layer of pure palladium beneath the top surface of soft gold insures pad on pad connector reliability and wirebond reliability. For connector applications, the use of relatively pure palladium ensures adequate wear resistance and chemical nobility to provide stable electrical contact in the event that mated contact wear through the soft gold surface finish occurs. For aluminum wirebonding, use of pure palladium underplating ensures the presence of a compliant underplate layer that can accommodate local interface stress buildup prompted from aluminum-gold intermetallic compound formation and growth between the gold surface plating and the aluminum wedgebond. Without the inherent compliancy characteristic of palladium plating stresses which arise from aluminum-gold intermetallic transformations become localized at the underplating interface and result in wirebond separation. Other materials that have adequate hardness for wear resistance are in general hardened through alloying or dopant addition. These alloying/dopant additions impart an undesirable structural rigidity on an atomic level which prompt stress buildup at wirebond interfaces which undergo intermetallic transformations, and can result in aluminum wirebond interface separation. Thickness control of the three plating layers and the combined total thickness of the palladium and soft gold layers are also critical to the reliability of resultant DCA wirebond, solder and pad on pad connector contacts as well. The palladium intermediate layer is plated to a nominal thickness of 35 microinches. In typical manufacturing processes, deviation in plating thicknesses can result from a variety of process variables. The range of plating thicknesses resulting from the process variations must support high yield manufacturing and reliability. Using a standard deviation of 3 microinches and upper and lower limits of three standard deviations, the actual range of plating thickness realized in practice is 26–44 microinches. By plating palladium within the thickness range of 26 to 44 microinches and soft gold within a thickness range of 5 to 30 microinches, while restricting the combined thickness of these two layers to no more than 70 microinches, reliability of all three contact types is achieved.

In many environments, it is not necessary that the intermediate coating (layer 39 of FIG. 5) of the tri-plate layered finish be a hard, pure noble metal. A hard, wear resistant layer may also be formed of hard gold where the gold has been hardened by doping with cobalt, nickel, iron, or a combination of those dopants. This layered finish also serves as a common surface treatment for wirebonding, soldering and wear resistant electrical connections. In order to ensure both high yield assembly and long term interconnection reliability, careful selection of plating layer thicknesses used and chemistry of wire used for the wirebonding process are also critical. To ensure stable and reliable mechanical interconnection of pad on pad or socketed electrical contacts, the wear resistant, doped, intermediate gold layer should be applied at thicknesses ranging from 20 to 40 microinches. For reliable solder joints, a third layer of high purity soft gold, having a thickness of 5 to 30 microinches, is used as the top surface finish over the intermediate layer of hardened doped gold. The combined thickness of the two gold layers should not exceed 55 microinches, as the use of thicker aggregate gold platings will result in incomplete gold dissolution into typically processed SMT solder interconnects and prompt residual gold-tin intermetallic formation at solder joint interfaces. Existence of gold-tin intermetallic reaction products at solder joint/carrier pad interfaces will degrade the mechanical strength and thermal cycling solder fatigue performance of the soldered interconnects. For wirebonding, use of aluminum wire does not provide sufficient long term wirebond interface reliability, as the doped hard gold will not provide for stress redistribution away from wirebond interfaces that result from aluminum-gold intermetallic compound formation reactions occurring between aluminum wirebonds and the soft gold surface layer. This wirebond reliability concern is avoided in one of two ways. First, by using the palladium coating of the prior embodiment as the intermediate hard, wear resistant layer when aluminum leads are attached and second, by using an attachment wire which eliminates the aluminum-gold intermetallic compound formation at the wirebond interfaces The alternative tri-plate layered finish provides for adequate connection using a combination of wirebonding, soldering and pad on pad connections when the leads to be wirebonded are gold or gold plated copper.

While the invention has been particularly shown and described with reference to preferred embodiments thereof, it will be understood by those skilled in the art that various other changes in the form and details may be made therein without departing from the spirit and scope of the invention.

What is claimed is:

1. A printed circuit device including an electrically insulating substrate on which are supported electrical conductors including multiple sets of termination pad sites for mounting and electrically connecting electronic elements to connect such printed circuit device to such electronic elements, said termination pad sites being processed using a single plating sequence to provide common plated layers comprising
    masking means overlying and electrically insulating said conductors and exposing said termination pad sites;
    a first plated layer of electrically conductive metal on said exposed termination pad sites that functions to prevent diffusion of the material of said termination pad sites therethrough;
    a second plated layer, overlying said first plated layer, of hard, wear resistant noble or semi-noble metal that provides connector reliability and affords metallurgically stable solder joint and wirebond interfaces in the presence of intermetallic compounds;
    a third plated layer, overlying said second plated layer, of soft gold which is readily wettable by solder, supports wirebond connections and presents a clean noble metal surface that prevents mechanical interconnect surface degradation; and
    electronic elements attached to said multiple sets of termination pad sites using pad on pad, wear resistant mechanical connection and at least one other attachment technique selected from the group consisting of wirebonding, direct chip attach (DCA) wire wedge bonding, and surface mount technology (SMT) or pin in hole (PIH) soldering.

2. The printed circuit device of claim 1 wherein said second plated layer is palladium having a thickness of 26 to 44 microinches.

3. The printed circuit device of claim 2 wherein said third plated layer of soft gold has a thickness of 5 to 30 microinches.

4. The printed circuit device of claim 1 wherein said second plated layer comprises hard gold having a thickness of 20 to 40 microinches and a Knoop scale hardness value of 130 to 250.

5. The printed circuit device of claim 4 wherein said second plated layer comprises gold doped with one of the group of cobalt, nickel, iron and any combination of such elements.

6. The printed circuit device of claim 4 wherein said third plated layer comprises soft gold having a thickness of 5 to 30 microinches.

7. The printed circuit device of claim 5 wherein the combined thickness of said second plated layer and said third plated layer does not exceed 55 microinches.

8. The printed circuit device of claim 1 wherein said first plated layer is formed of nickel having a minimum thickness of 80 microinches.

9. A printed circuit device comprising an electrically insulating substrate on which are supported conductors which include termination pads for mounting electronic elements and for connecting said printed circuit device to other electronic devices, such termination pads having a common surface plating structure provided by a single plating sequence upon which a plurality of methods of attachment, including soldering, wirebonding, and pad on pad connector mechanical attachment, may be effected comprising
    masking means overlying said conductors and exposing said pads;
    an initial plated coating of nickel covering said pads and having a thickness that prevents diffusion therethrough of the material of said pad that underlies said nickel coating;
    said initial plated coating having plated thereon an intermediate plated coating of noble or semi-noble metal with a thickness and hardness to support soldering, wirebonding and pad on pad mechanical connections;
    a final plated coating of soft gold plated over said intermediate plated coating; and
    electronic elements attached to said termination pads using pad on pad, wear resistant mechanical connection and at least one other attachment technique selected from the group consisting of wirebonding, direct chip attach (DCA) wire wedge bonding, and surface mount technology (SMT) or pin in hole (PIH) soldering.

10. The printed circuit device of claim 9 wherein said initial plated coating of nickel has a thickness of at least 80 microinches.

11. The printed circuit device of claim 10 wherein said intermediate plated coating is palladium having a thickness of 26 to 44 microinches.

12. The printed circuit device of claim 11 wherein said final plated coating of soft gold has a thickness of 5 to 30 microinches.

13. The printed circuit device of claim 9 wherein said intermediate plated coating comprises a 20 to 40 microinch thick layer of gold doped with one of the group of cobalt, nickel, iron and any combination of the elements cobalt, nickel and iron to establish an intermediate plated coating hardness of Knoop scale 130 to 250.

14. The printed circuit device of claim 13 wherein said final plated coating of soft gold has a thickness of 5 to 30 microinches and the combined total thickness of said intermediate plated coating and said final plated coating does not exceed 55 microinches.

* * * * *